US006476594B1

(12) United States Patent
Roisen

(10) Patent No.: US 6,476,594 B1
(45) Date of Patent: Nov. 5, 2002

(54) METHOD AND APPARATUS FOR TESTING HIGH FREQUENCY DELAY LOCKED LOOPS

(75) Inventor: Roger L. Roisen, Minnetrista, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/870,949

(22) Filed: May 31, 2001

(51) Int. Cl.[7] .................................................. H03L 7/06

(52) U.S. Cl. ..................... 324/76.54; 327/156

(58) Field of Search ................................ 327/407, 147, 327/149, 150, 156, 158, 159, 161; 375/376; 324/76.54, 765, 158.1, 617, 76.35, 601

(56) References Cited

U.S. PATENT DOCUMENTS

| | | | | |
|---|---|---|---|---|
| 5,717,353 A | * | 2/1998 | Fujimoto | 327/155 |
| 6,285,225 B1 | * | 9/2001 | Chu et al. | 327/149 |
| 6,396,889 B1 | * | 5/2002 | Sunter et al. | 375/376 |

* cited by examiner

Primary Examiner—N. Le
Assistant Examiner—Vincent Q. Nguyen
(74) Attorney, Agent, or Firm—Westman, Champlin & Kelly

(57) ABSTRACT

A delay-locked loop circuit is provided which includes a delay-locked loop, a delay element and a multiplexer. The delay-locked loop has a reference clock input, a feedback clock input and a clock output. The delay element has a delay input which is coupled to the clock output and a delay output. The multiplexer has a first multiplexer input which is coupled to the clock output, a second multiplexer input which is coupled to the delay output and a multiplexer output which is coupled to the feedback input.

14 Claims, 3 Drawing Sheets

METHOD AND APPARATUS FOR TESTING HIGH FREQUENCY DELAY LOCKED LOOPS

BACKGROUND OF THE INVENTION

The present invention relates to semiconductor integrated circuits and, more particularly, to a method and apparatus for testing high frequency delay locked loops with low frequency production testers.

Delay-locked loops (DLLs) are used in integrated circuits, such as application specific integrated circuits (ASICs) for removing phase differences between clocks, such as phase differences caused by propagation delay. A typical DLL includes a phase detector, a charge pump, a loop filter and a voltage-controlled delay line. The phase detector detects a phase difference between a reference clock signal and a feedback clock signal. The phase detector generates a phase control signal as a function of the phase difference and applies the phase control signal to the charge pump, which increases or decreases a voltage across the loop filter. This voltage is applied to the voltage-controlled delay line for controlling the propagation delay through the delay line. The reference clock is fed through the delay line to generate an output clock, which is fed back to the phase detector as the feedback clock, typically through additional logic such as a binary clock tree. The delay line advances or retards the phase of the output clock until the phase of the feedback clock matches the phase of the reference clock. The DLL has then locked the output clock signal onto the phase of the reference input signal.

As with other types of logic in an integrated circuit, fabrication faults can effect the functionality of a DLL. Embedded DLLs are tested by applying a test clock signal to the reference input of the DLL and then measuring the resulting frequency at the clock output of the DLL. However, a DLL normally requires that the test clock signal be within the DLLs "locking range" in order to lock the output clock signal onto the phase of the test clock signal. As the operating frequencies of DLL's continue to increase, it is becoming more difficult for production test equipment to provide a DLL with a test clock signal that is within the locking range. For example, most production testers available today have a maximum frequency of 100 megahertz (MHz). However, a 500 MHz DLL would require a test clock signal having a frequency of about 500 MHz in order to lock. Modern VLSI production tester cannot provide a reference lock at 500 MHz. Even if these testers were modified to provide a 500 MHz reference clock signal, the cost of these testers would become prohibitive. As a result, high-speed DLLs are typically not tested with the other internal logic of an integrated circuit prior to packaging. Any functional problems associated with the DLL would therefore not be detected until after the integrated circuit has been packaged, which increases the expense associated with such faults.

An improved method of testing high-speed DLLs is therefore desired.

SUMMARY OF THE INVENTION

One aspect of the present invention is directed to a delay-locked loop circuit which includes a delay-locked loop, a delay element and a multiplexer. The delay-locked loop has a reference clock input, a feedback clock input and a clock output. The delay element has a delay input which is coupled to the clock output and a delay output. The multiplexer has a first multiplexer input which is coupled to the clock output, a second multiplexer input which is coupled to the delay output and a multiplexer output which is coupled to the feedback input.

Another aspect of the present invention is directed to a method of testing a delay-locked loop that is embedded within an integrated circuit. According to the method, a test clock is applied to a reference clock input of the delay-locked loop, wherein the test clock signal has a frequency that is outside a normal locking range of the delay-locked loop. The normal locking range of the delay-locked loop is lowered to a test locking range, wherein the frequency of the test clock signal is within the test locking range. A representation of an output clock signal generated by the delay-locked loop on a clock output of the delay-locked loop in response to the test clock signal is detected when the delay-locked loop has the test locking range.

Another aspect of the present invention is directed to an integrated circuit having an embedded delay-locked loop with a reference clock input, a feedback clock input, a test control input, a clock output and a feedback path from the clock output to the feedback clock input. The integrated circuit further includes a circuit for selectively changing a locking range of the delay-locked loop from a first frequency range to a second, slower frequency range as a function of a test control signal applied to the test control input.

DETAILED DESCRIPTION OF ILLUSTRATIVE EMBODIMENTS

Figure 1:
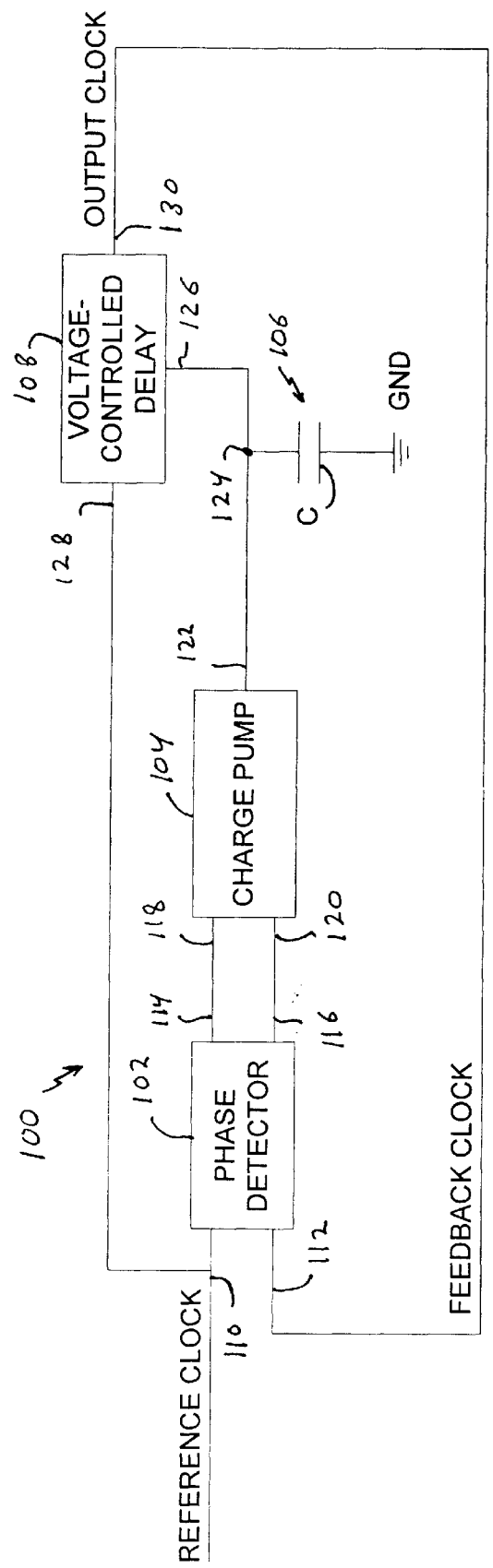
FIG. 1 is a simplified schematic diagram of a typical delay clocked loop according to the prior art.

FIG. 1 is simplified schematic diagram of a delay clocked loop according to the prior art. Delay-locked loop ("DLL") 100 includes a phase detector 102, a charge pump 104, a loop filter 106 and a voltage-controlled delay line 108. Phase detector 102 has a reference clock input 110, a feedback clock input 112 and charge pump control outputs 114 and 116. Outputs 114 and 116 are coupled to inputs 118 and 120 of charge pump 104. Charge pump 104 has an output 122 which is coupled to loop filter node 124 and control input 126 of voltage-controlled delay line 108. Loop filter 106 is formed by a capacitor "C" which is coupled between loop filter node 124 and ground terminal GND. Voltage-controlled delay line 108 has a clock input 128 coupled to reference clock input 110 and a clock output 130 coupled to feedback clock input 112.

During operation, phase detector 102 detects a phase difference between a reference clock applied to input 110 and a feedback clock applied to input 112. Phase detector 102 generates "up" and "down" control signals on outputs 114 and 116 as a function of the difference. The "up" and "down" control signals are applied to charge pump 104, which cause charge pump 104 to increase, decrease or not change the voltage on loop filter 124. Voltage-controlled delay line 108 includes one or more delay elements which are coupled together in series between clock input 128 and clock output 130. Voltage-controlled delay line 108 adjusts the propagation delay through each of these delay elements as a function of the voltage on loop filter node 124. The output clock signal generated on clock output 130 is fed back to phase detector 102 as the feedback clock signal. Voltage-controlled delay line 108 continues to adjust its propagation delay as a function of the loop filter voltage until the phase of the feedback clock signal matches the phase of the reference clock signal.

In a typical DLL circuit, there would be one or more logic elements coupled between clock output 130 and feedback clock input 112, and the DLL would be used to remove any phase error caused by propagation delay and loads within these elements. For example, clock output 130 can be used to feed a binary clock tree on the integrated circuit, which distributes the output clock to the various sequential elements on the integrated circuit in one or more clock domains. One of the taps of the binary clock tree would be fed back to feedback input 112 so DLL 100 could remove any phase error or "clock skew" between that clock tap and the reference clock. In addition, DLL 100 can be used in many other applications.

The operation of DLL 100 is tested by mounting the integrated circuit on which DLL 100 is fabricated to a tester. The tester provides a test clock signal to reference clock input 110 and measures the frequency of the output clock signal produced at clock output 130. If the frequency of output clock signal matches the expected clock frequency, DLL 100 is assumed to be operational. If not, there may be some fault associated with DLL 100.

With high-speed DLLs of the prior art, such as that shown in FIG. 1, the tester may not be capable of providing a test clock signal that is within the locking range of the DLL. For example, a 500 MHz DLL would require a test clock signal of roughly 500 MHz in order lock. However, a typical production tester has a maximum frequency of 100 MHz, for example. As a result, most high-speed DLLs of the prior art are not tested prior to packaging.

Figure 2:
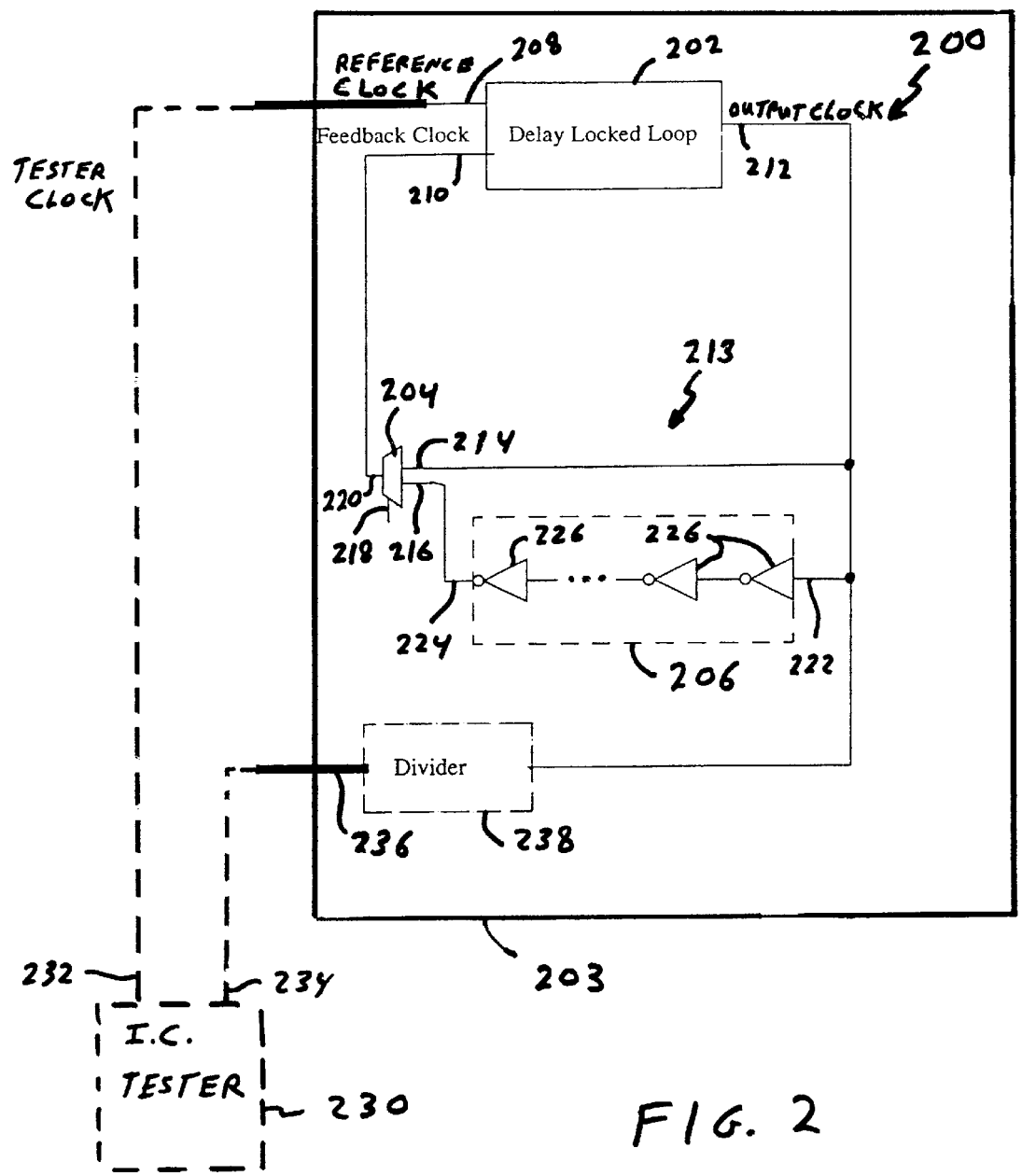
FIG. 2 is a diagram of a delay locked loop circuit according to one embodiment of the present invention.

FIG. 2 is a schematic diagram of a DLL circuit according to one embodiment of the present invention, which allows the DLL to be tested by a relatively slow test clock signal. DLL circuit 200 is embedded within an integrated circuit, shown generally at 203. DLL circuit 200 includes a typical high-speed DLL 202, a test select multiplexer 204 and a delay element 206. DLL 202 can include any type of DLL, such as the DLL shown in FIG. 1. Other DLLs can also be used, which can utilize a variety of different types of phase detection and correction techniques.

DLL 202 includes a reference clock input 208, a feedback clock input 210 and a clock output 212. In one embodiment, these inputs and outputs correspond to reference clock input 110, feedback clock input 112 and clock output 130, respectively, of DLL 100 shown in FIG. 1. Clock input 208 can be coupled to any clock source, such as an on-chip clock source or an input clock pin of integrated circuit 203. Clock output 212 is coupled in a feedback path 213 to feedback input 210. Feedback path 213 includes test select multiplexer 204 and delay element 206. Test select multiplexer 204 includes a first multiplexer input 214, a second multiplexer input 216, a select input 218 and a multiplexer output 220. Delay element 206 includes a delay input 222, a delay output 224 and a plurality of semiconductor delay cells 226 coupled in series between delay input 222 and delay output 224. In one embodiment, delay cells 226 include an even-numbered series of inverting buffers so that the overall delay element is non-inverting. Other types of cells can also be used.

Clock output 212 of DLL 202 is coupled to the first multiplexer input 214 and is coupled to the second multiplexer input 216 through delay element 206. Multiplexer output 220 is coupled to feedback clock input 210 of DLL 202. Multiplexer select input 218 is coupled to test control circuitry (not shown) on integrated circuit 203. Alternatively, select input 218 can be coupled to an external pin of the integrated circuit.

During normal operation, multiplexer select input 218 is controlled to couple the output clock signal on multiplexer input 214 to multiplexer output 220. In this mode, DLL circuit 220 has target frequency within a normal locking range. Any reference clock signal that is applied to reference clock input 208 would have to have a frequency that is within the normal locking range in order for DLL circuit 220 to lock the phase of the feedback clock signal to the phase of the reference clock signal. For example, a 500 MHz DLL would have a target frequency of 500 MHz and a normal locking range that spans 500 MHz, such as 400 MHz to 700 MHz. The size of the locking range can vary depending on the type of DLL that is used and the semiconductor technology that is used to fabricate the integrated circuit.

When DLL circuit 200 is to be tested, integrated circuit 203 is mounted within an integrated circuit test apparatus 230 (shown in phantom). Among other outputs and inputs, test apparatus 230 has a test clock output 232 and a test clock input 234. Test clock output 232 is coupled to reference clock input 208 of DLL 202 either directly or through one or more intermediate elements on; integrated circuit 203. Test clock input 234 is coupled to test clock output 236 of integrated circuit 203, which is coupled to clock output 212 through an optional frequency divider 238. Tester 230 can also have one or more control outputs (not shown) that are used to place integrated circuit 203 in a test mode.

When integrated circuit 203 is in the test mode, tester 230 supplies a test clock signal to the reference clock input 208 of DLL 202. Test control circuitry (also not shown) on integrated circuit 203 controls multiplexer select input 218 to couple the second multiplexer input 216 to multiplexer output 220. As the output clock signal produced on clock output 212 propagates through delay element 206, the resulting clock signal applied to multiplexer input 216 is delayed relative to the output clock signal applied to multiplexer input 214. The amount of the delay is determined by the propagation delay of each delay cell 226 and the number of delay cells 226 in delay element 206.

In one embodiment, the total propagation delay through delay element 206 is approximately equal to the cycle time of the test clock signal produced by tester 230 minus the cycle time of the DLL target frequency. In the above example, if the test clock signal produced by tester 230 has a frequency of 100 MHz, then the cycle time of the test clock signal would be $10 \times 10^{-9}$ seconds. If the normal target frequency of DLL 200 is 500 MHz, then the cycle time of the DLL would be $2 \times 10^{-9}$ seconds. The total propagation delay through delay element 206 would therefore be $10 \times 10^{-9}$ seconds $- 2 \times 10^{-9}$ seconds $= 8 \times 10^{-9}$ seconds.

The introduction of delay element 206 in feedback path 213 slows the cycle time of DLL 200 such that the frequency of the test clock signal produced by tester 230 is within the locking range of DLL 200 in test mode. Delay element 206 effectively lowers the normal locking range of DLL 200 from a first frequency range (such as 400 MHz to 700 MHz) to a second frequency range (such as 90 MHz to 110 MHz) so as to enable DLL 200 to lock on to the test clock signal. As mentioned above, the amount of delay through delay element 206 is "approximately" equal to the cycle time of the test clock signal minus the cycle time of the DLL target frequency. The actual propagation delay can be any delay value that allows the frequency of the test clock signal to fall within the adjusted locking range of the DLL in the test mode.

The resulting output clock signal that is produced by DLL 200 on clock output 212 is fed back to tester 230 through test clock output 232. In one embodiment, divider 238 is coupled in series with clock output 212 in order to slow the output clock signal to a frequency that can be measured by the tester.

As shown in FIG. 2, with the addition of a small number of components to the DLL, a typical VLSI production tester can be used for testing DLLs having target frequencies that are much greater than the maximum frequency of the tester. This reduces the expense of the tester and allows high-speed DLLs to be tested prior to packaging.

Figure 3:
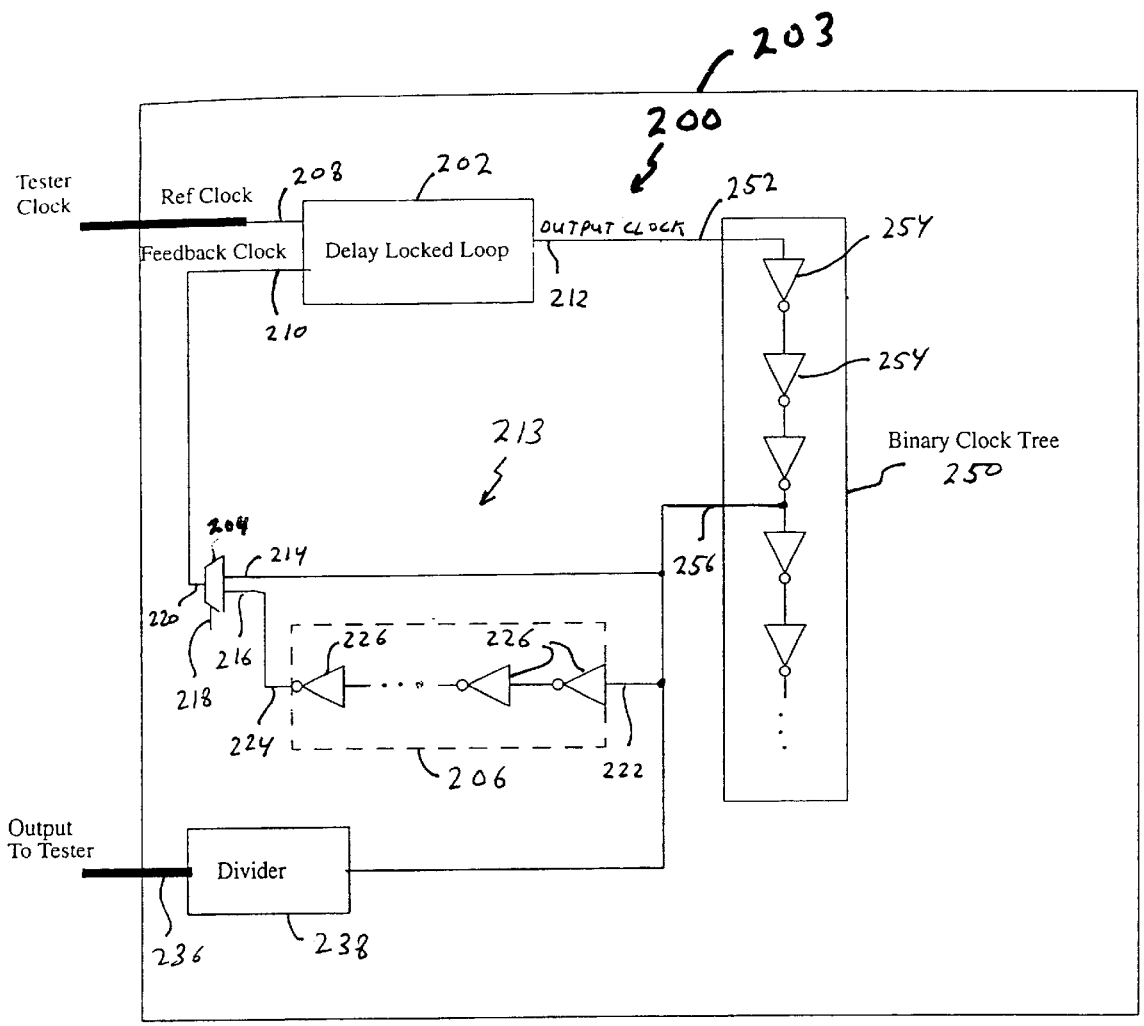
FIG. 3 is a diagram illustrating an implementation of the delay locked loop shown in FIG. 1 for driving a binary clock tree.

FIG. 3 is a schematic diagram illustrating one implementation of DLL 200 according to one embodiment of the present invention. The same reference numerals are used in FIG. 3 as were used in FIG. 2 for the same or similar elements. In this implementation, clock output 212 is coupled to input 252 of binary clock tree 250. Binary clock tree 250 includes a plurality of inverting buffers 254 for distributing the output clock to various clock domains and sequential elements within integrated circuit 203. One of these distributed clock signals, such as the one produced on tap 256, is used as the feedback clock signal for DLL 200 so that DLL 200 can remove any clock skew between the distributed clock signal and the reference clock signal. Tap 256 is coupled to multiplexer input 214 and to input 222 of delay element 206. In an alternative embodiment, clock output 212 is coupled directly to multiplexer input 214 and input 222 of delay element 206.

Although the present invention has been described with reference to preferred embodiments, workers skilled in the art will recognize that changes may be made in form and detail without departing from the spirit and. scope of the invention. For example, any method of selectively inserting a delay in the DLL feedback path can be used in alternative embodiments of the present invention. Also, the particular frequencies and frequency ranges mention above are provided as examples only. Other frequencies and frequency ranges can also be used in alternative embodiments of the present invention. In addition, the term "coupled" used in the specification and the claims can include various types of connections or couplings and can include a direct connection or a connection through one or more intermediate components.

What is claimed is:

1. A delay-locked loop circuit comprising:
   a delay-locked loop having a reference clock input, a feedback clock input and a clock output;
   a delay element having a delay input coupled to the clock output and a delay output; and
   a multiplexer having a first multiplexer input coupled to the clock output, a second multiplexer input coupled to the delay output and a multiplexer output coupled to the feedback input.

2. The delay-locked loop of claim 1 wherein the delay element comprises a plurality of semiconductor cells connected together in series between the delay input and the delay output.

3. The delay-locked loop circuit of claim 1 wherein the multiplexer further comprises:
   a normal operating state in which the multiplexer couples the first multiplexer input to the multiplexer output; and
   a test state in which the multiplexer couples the second multiplexer input to the multiplexer output.

4. The delay-locked loop circuit of claim 3 wherein the delay locked loop comprises a first target frequency when the multiplexer is in the normal operating state and a second target frequency, which is smaller than the first target frequency, when the multiplexer is in the test state.

5. A method of testing a delay-locked loop that is embedded within an integrated circuit, the method comprising:
   (a) applying a test clock to a reference clock input of the delay-locked loop, wherein the test clock signal has a frequency that is outside a normal locking range of the delay-locked loop;
   (b) lowering the normal locking range of the delay-locked loop to a test locking range, wherein the frequency of the test clock signal is within the test locking range; and
   (c) detecting a representation of an output clock signal generated by the delay-locked loop on a clock output of the delay-locked loop in response to the test clock signal when the delay-locked loop has the test locking range.

6. The method of claim 5 wherein step (c) comprises:
   (c)(1) dividing a frequency of the output clock signal from a first frequency to a second, lower frequency and detecting a representation of the output clock signal at the second frequency.

7. The method of claim 5 wherein step (a) comprises generating the test clock signal with a tester that is external to the integrated circuit and step (d) comprises detecting the representation of the output clock signal with the tester.

8. The method of claim 5 wherein step (b) comprises:
   (b)(1) selectively inserting a delay element within a feedback path in the delay-locked loop that is coupled between the clock output and a feedback clock input of the delay-locked loop.

9. The method of claim 8 wherein:
   the test clock signal has a cycle time;
   the delay locked loop has a target cycle time when the delay-locked loop has the normal locking; and
   the delay element has a propagation delay that is approximately equal to the cycle time of the test clock signal minus the target cycle time of the delay locked loop.

10. The method of claim 8 wherein step (b)(1) comprises:
    (b)(1)(i) coupling the clock output to a first input of a multiplexer;
    (b)(1)(ii) coupling the clock output to a second input of a multiplexer, through the delay element;
    (b)(1)(iii) coupling an output of the multiplexer to the feedback clock input of the delay-locked loop; and
    (b)(1)(iv) switching the multiplexer from a normal operating state, in which the first multiplexer input is coupled to the output of the multiplexer, to a test state, in which the second multiplexer input is coupled to the output of the multiplexer.

11. An integrated circuit comprising:
    an embedded delay-locked loop having a reference clock input, a feedback clock input, a test control input, a clock output and a feedback path from the clock output to the feedback clock input; and
    means for selectively changing a locking range of the delay-locked loop from a first frequency range to a second, slower frequency range as a function of a test control signal applied to the test control input.

12. The integrated circuit of claim 11 wherein the means for selectively changing the locking range comprises:
    means for selectively inserting a delay element into the feedback path as a function of the test control signal.

13. The integrated circuit of claim 12 wherein the means for selectively inserting comprises:
    a multiplexer having a first multiplexer input which is coupled to the clock output, a second multiplexer input which is coupled to the clock output through the delay element, and a multiplexer output coupled to the feedback input.

14. The integrated circuit of claim 12 wherein the delay element comprises a plurality of semiconductor buffer cells coupled together in series with one another.

* * * * *